United States Patent [19]
Yamamoto

[11] Patent Number: 6,139,643
[45] Date of Patent: Oct. 31, 2000

[54] EFFUSION CELL FOR SI AND MOLECULAR BEAM EPITAXY SYSTEM

[75] Inventor: Takatoshi Yamamoto, Kyoto, Japan

[73] Assignee: Nissin Electric Co., Ltd., Kyoto, Japan

[21] Appl. No.: 09/014,656

[22] Filed: Jan. 28, 1998

[30] Foreign Application Priority Data

Jan. 29, 1997 [JP] Japan ................................. 9-031096

[51] Int. Cl.⁷ ................................................ C23C 16/00
[52] U.S. Cl. ................................ 118/726; 118/715
[58] Field of Search .................................... 118/726, 715

[56] References Cited

U.S. PATENT DOCUMENTS

| | | | |
|---|---|---|---|
| 4,239,955 | 12/1980 | Cho | 219/271 |
| 4,330,360 | 5/1982 | Kubiak et al. | 156/610 |
| 4,383,872 | 5/1983 | Roberts | 148/175 |
| 5,034,604 | 7/1991 | Streetman et al. | 250/251 |
| 5,336,324 | 8/1994 | Stall et al. | 118/719 |
| 5,544,618 | 8/1996 | Stall et al. | 117/102 |
| 5,827,371 | 10/1998 | Colombo et al. | 118/726 |

FOREIGN PATENT DOCUMENTS 7-9372  3/1995  Japan .

*Primary Examiner*—Christopher A. Fiorilla
*Attorney, Agent, or Firm*—Finnegan, Henderson, Farabow, Garrett & Dunner, L.L.P.

[57] ABSTRACT

A crucible is formed of metal, that is, any one of Mo, Ta and W with a thickness of 3 mm or more, and the crucible is melted to produce melted Si liquid, thereby forming a molecular beam. An inner surface of the crucible can be coated with silicide. Also, resistance-type heaters can be used to heat solid Si in the crucible into the liquid Si. Such heaters can include reflection portions surrounding the crucible. The crucible can be used as an effusion cell in a molecular beam epitaxy system.

3 Claims, 5 Drawing Sheets

EFFUSION CELL FOR SI AND MOLECULAR BEAM EPITAXY SYSTEM

BACKGROUND OF THE INVENTION

1. Field of the Invention

The present invention relates to a effusion cell for Si which is used to obtain a sufficient quantity of Si molecular beam to produce a film in an MBE (molecular beam epitaxy) device, and a molecular beam epitaxy system using such effusion cell for Si.

2. Description of the Related Art

An MBE device is a device which applies a molecular beam of a proper material to a substrate heated in an ultrahigh vacuum to thereby produce a thin film of the material. Here, description will be given below generally of a molecular beam epitaxy system (MBE device) with reference to FIG. 2. In FIG. 2, the MBE device includes a manipulator 1 in the central upper portion thereof and the manipulator 1 supports a substrate 2, which faces downward. The manipulator 1 has a function to rotate the substrate 2 and a function to heat the substrate 2 An effusion cell 3 is used to radiate a molecular beam of a certain material toward the surface of the substrate. Actually, there are provided a plurality of effusion cells 3 which are arranged in a radial manner. The MBE device further includes a chamber 6 and shrouds 5 of liquid nitrogen which are disposed near to the wall surface of the chamber 6, while the liquid nitrogen shrouds 5 absorb gas to thereby prevent mutual heat interference. The chamber 6 can be made into an ultrahigh vacuum. The chamber 6 is connected with another vacuum chamber, while wafers can be replaced in such vacuum chamber. Since the effusion cell 3 is oblong or long lengthwise, it is easy to install four to eight effusion cells 3. When the MBE device is of a large size, ten or more effusion cells can be provided.

As a device which generates a molecular beam, normally, there is used a effusion cell 3 (K-cell; Knudsen cell). While the effusion cell 3 includes various modified versions, an example of the effusion cell 3 will be described in detail with reference to FIG. 4. In FIG. 4, there is provided a cylindrical crucible 8 with a bottom, while a heater 9 is disposed so as to enclose the crucible 8. This heater 9 is a ribbon-shaped heater or a coil-shaped resistance type heater. Further, outside the heater 9, there are disposed a plurality of cylindrical reflection plates (reflectors) 10. These reflection plates 10 are used to reflect the heat of the heater 9 and return it toward the crucible 8. The molecular cell 3 further includes a plurality of reflection plates 11 on the bottom surface thereof as well. The reflection plates, each of which is formed of a thin tantalum (Ta) plate, are superimposed on top of one another.

Below the crucible 8, there is disposed a disk-shaped support plate 12, and the outer-most ones of the side surface reflection plates 10 are connected to the support plate 12. The crucible 8 includes in the top portion thereof a flange portion 13 which is supported by the top ends of the reflection plates 10. In particular, the crucible 8 is supported by the support plate 12 through the reflection plates 10. The support plate 12 is also connected through a prop 14 (see FIG. 1) to an ultrahigh vacuum flange 15 which is disposed further downward. The ultrahigh vacuum flange 15 is mounted onto the flange 16 of the chamber 6 by a screw. If the screw is removed, then the ultrahigh vacuum flange 15 can be take out clean.

A thermocouple 17 is so disposed that the tip end thereof is in contact with the bottom portion of the crucible 8. While a material solid is to be charged into the crucible, the material solid is heated in a vacuum and is thereby turned into material liquid 18. The material liquid 18 evaporates in a liquid state and turns into a molecular beam. Depending on the kind of material, however, there is a case that it turns (that is, sublimes) from a solid state directly to a gaseous state without passing through a liquid state. For example, materials such as arsenic (As), phosphorus (P) and the like cannot take the form of a liquid state and, therefore, they are sublimed and are thereby turned into molecular beams. A crucible often uses PBN (Pyrolytic Boron Nitride) as the material thereof.

Since PBN has high resistance against heat and does not react on many substances, PBN is the most suitable for the material of a crucible. It is believed that nothing is better than PBN as a molecular beam crucible. This is the reason why PBN is used as the material of a crucible for most materials. An effusion cell is composed of an oblong PBN crucible 8, a resistance heating type heater 9 for enclosing the PBN crucible 8, and a plurality of cylindrical reflection plates 10. The arrangement shown in FIG. 2 is an ordinary molecular beam epitaxy system in which a plurality of effusion cells shown in FIG. 4 are provided upwardly and obliquely. With use of this molecular beam epitaxy system, substances such as Ga, As, In, P, Al, B and the like can be flown.

Si presents a problem in an effusion cell. Because Si has a high melting point (1410° C.), it does not melt easily. Also, molten Si is extremely reactive. When a thin film formed of GaAs or InP and Si is added in a minute quantity as a dopant, in the case of Si, there is used an effusion cell using a conventional PBN crucible. In GaAs, Si may become an n-type impurity or a p-type impurity according to conditions. That is, Si is important as the dopant. When Si is used as a dopant, since the flux (the beam dose per unit time) of a molecular beam may be small, Si is not melted but Si, as it is in a solid state, is sublimed into a molecular beam. Because Si is held in its solid state and is not melted, even a crucible of PBN can hold Si therein. That is, although the cell temperature is lower than the melting point of Si, a slight amount of molecular beam can be generated. In other words, if Si is added in a slight amount as an impurity, then the above-mentioned structure using the PBN crucible can achieve its expected object.

However, there has come up a case which requires a stronger Si flux; for example, a case in which a Si thin film is formed. Here, let us describe three new demands: Firstly, there arises a demand in which a Si/Ge mixed crystal film is used as the material of a light emitting element. Since Si is a semiconductor of an indirect transition type, it is difficult for Si to emit light. However, it is said that Si can be turned into a direct transition type if it is mixed with Ge to thereby produce a mixed crystal, and thus the Si/Ge mixed crystal film has been studied as the material of the light emitting element that can be substituted for GaAs or the like. When producing a mixed crystal film, the molecular beam requires a fairly high intensity. Referring now to a second demand, it is expected that, if a Si thin film is formed uniformly on a Si wafer and a DRAM is formed on such Si thin film, then the resultant Si film may be better in quality than a Si film which is formed directly on a Si wafer. In this case, because a uniform Si film is formed, a strong flux is necessary. Such a weak molecular beam as flies away an impurity takes too much time and thus it is not practical.

As a third demand, a Si film is attached to a GaAs wafer and a new active element is produced on this Si film. This is a new and hopeful trial.

The above-mentioned cases are respectively trials in an experimental stage and require a strong Si molecular beam. To enhance the intensity of the Si molecular beam, it is also necessary that Si is melted into a liquid state and the melted Si liquid is then caused to evaporate. The melted Si liquid is strongly reactive and thus reacts on the crucible to thereby denature the material of the crucible. There is no available receptacle which can be so strong and heat resistant that can bear the melted Si liquid of high temperatures. In a PBN crucible which is normally used in the MBE, there arises a problem that it reacts on the melted Si liquid and the thus reacted material is taken into a growth film. Conventionally, there is no other way but to use Si itself as a receptacle. That is, part of a lump of solid Si is melted and the remaining solid portions of Si are used to hold the thus melted Si liquid therein. By the way, it is not possible for the resistance heating type heater to melt only the local portion of the solid Si.

Thus, there is used an electronic beam heating method (EB heating method) which is capable of heating the solid Si locally. Here, FIG. 3 shows a Si molecular beam source using an electronic beam heating method. A crucible 19 for an EB gun is a shallow receptacle, while a Si solid 20 is stored in this crucible 19. There is provided an EB gun which emits an electronic beam 21, while an electronic beam emitted from the EB gun is curved by a magnetic field and is thereby caused to collide with the upper surface of the Si solid 20. The thus collided electrons lose their kinetic energy to thereby generate heat here. The solid Si is partly melted due to the thus generated heat. Because the area of the solid Si with which the electronic beam is collided is small, the remaining portions of the solid Si still remain solid. Since the electronic beam is so guided as to collide just with the upper surface of the solid Si, the solid portions of Si provide a shape like a pond. Accordingly, the melted Si liquid 22 can be stored in this pond. And, the periphery of the pond is the solid Si 20 and thus it can be held by the crucible 19 formed of metal. There is no possibility that the metal crucible 19 can be invaded or affected by Si.

As described above, to produce a Si molecular beam having a large flux, there is used an electronic beam heating method. In FIG. 1, there is shown a general section view of a molecular beam epitaxial growth device using an effusion cell and an EB gun in combination. In a portion of the chamber 6, there is formed a laterally facing cylindrical portion, while a special flange 24 extending perpendicularly to the chamber 6 cylindrical portion is provided in front of the chamber 6 cylindrical portion; and, an ultrahigh vacuum flange 23 with an EB gun 4 mounted thereon is fixed to the flange 24. Further forwardly of the EB gun 4, there is disposed a crucible 19 for an EB gun and the Si solid 20 is stored in the EB crucible 19. An electronic beam is emitted from the EB gun 4, is curved by a magnetic field and is thereby collided with the top portion of the Si solid 20, so that, as shown in FIG. 3, a pond for the melted Si solid 22 is produced in the top portion of the Si solid 20. The molecular beam of Si is radiated from the melted Si liquid 22 toward the substrate 2.

Si is a metal which is high in the melting point and is very hard to handle. The PBN crucible cannot be used for Si and, for this reason, under the existing circumstances, there is no other way but to heat and fly Si using an electronic beam. In this case, such heating is executed locally and thus Si is locally melted into liquid. However, since the state of the electronic beam used is not stable, the quantity of the melted Si liquid varies all the time. Due to this, the quantity of the electronic beam varies with the passage of time and is thus not stable. While the thickness of the Si thin film is controlled on the basis of time, if the beam flux is unstable, then the thickness of the Si thin film is varied. The above-mentioned molecular beam epitaxial growth method is used to make a thin film such as a superlattice or the like to grow in a well controllable manner and, therefore, the thickness of the thin film must be controlled with accuracy. However, the above-mentioned local heating using the EB gun is unstable in this respect.

Also, in the electronic beam heating method, there exists a second problem. In particular, because the Si solid is struck by the electronic beam, part of the Si solid is ionized when it is flown. If such ionized Si attaches to the shroud, then the present portion of the shroud is charged with electricity. That is, due to such electrification, a flake (the attached material which is irregular in shape) can fly around to thereby contaminate a specimen.

Further, the electronic beam heating method raises another problem. Specifically, as can be seen from FIG. 1 as well, since the EB gun is mounted in the molecular beam epitaxy system in such a manner that it faces laterally, the EB gun occupies a wider space. When using a medium-sized molecular beam epitaxy system which is not so small as an ordinary PBN effusion cell, 8 pieces of PBN cells or so can be mounted. However, in the electronic beam heating method, only 4 pieces of EB guns or so can be mounted. And, when the PBN cells and EB guns are used together, a desired number of effusion cells cannot be mounted because the existence of the EB guns provides an obstacle to such mounting.

As described above, when Si is flown using the EB guns according to the electronic beam heating method, there are raised many problems. There still exists a strong requirement to fly Si by means of a normal effusion cell according to the resistance heating method using rather a crucible than the EB gun. In view of this, the present inventors have already invented a Si effusion cell which is very skillful. In particular, it is disclosed in Unexamined Japanese Utility Model Publication No. Hei. 3-116027 under the title of "A effusion cell for high temperature". In this application, a heater insulation member is formed of a sapphire, a crucible is formed of a sapphire, high-purity alumina and high-purity carbon, and a heater is formed of tungsten. Since the heater is held by the sapphire, even if Si is raised up to such high temperatures that can melt Si, there is no possibility that impurities can be flown around. On the other hand, when the crucible is formed of PBN, then nitrogen is flown to thereby contaminate a specimen. However, if the crucible is formed of a sapphire, then no nitrogen can be flown and the crucible can stand the high temperatures. Therefore, the whole of Si can be melted into liquid and the liquid Si can be held well.

Use of such crucible and resistance heating is very effective. However, since a large quantity of sapphires must be used, the effusion cell is very expensive as a whole. Although PBN is also expensive, when the sapphire is used as the material of the crucible and heater insulation member, then the resultant effusion cell is quite expensive as a whole. In view of this, there still exists a requirement to be able to obtain a device which not only is practical in cost but also is capable of turn Si into a molecular beam using a resistance heating method and a cylindrical crucible.

SUMMARY OF THE INVENTION

It is an object of the invention to provide a effusion cell which can turn Si into a molecular beam without using an EB gun.

It is another object of the invention to provide a Si effusion cell which can obtain a practically sufficient flux without using an EB gun.

Further, it is still another object of the invention to provide a molecular beam epitaxy system which can use a Si effusion cell smaller in size than an EB gun and can store a larger number of effusion cells including a Si effusion cell.

DETAILED DESCRIPTION OF THE INVENTION

Figure 1:
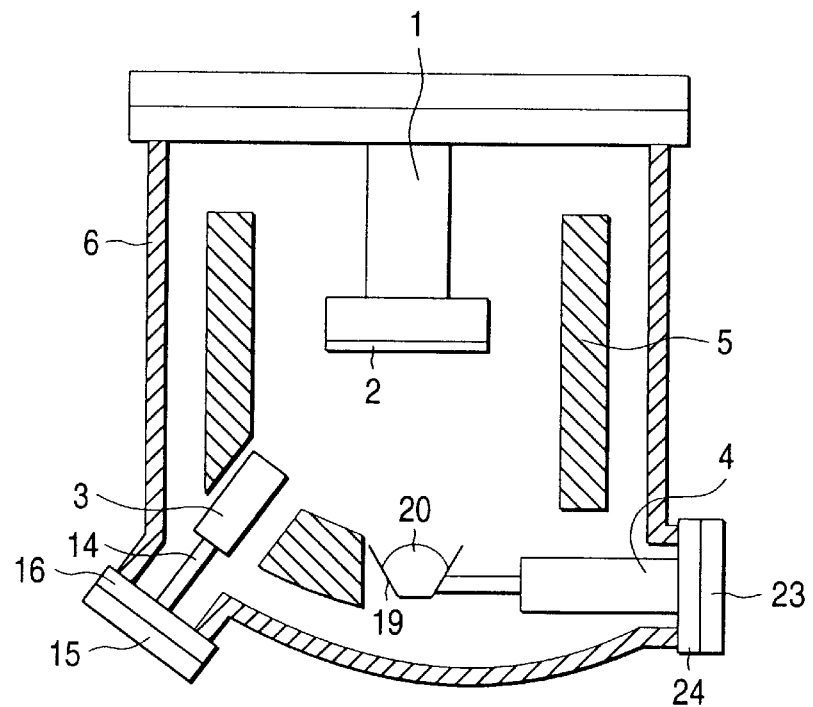
FIG. 1 is a schematic section view of a molecular beam epitaxy system including a conventional Si effusion cell using an EB gun.

Detailed description of the present invention will be described as follows.

The present invention provides an effusion cell for Si in which a crucible having a thickness of 3 mm or more and formed of tantalum, tungsten, or molybdenum is heated according to a resistance heating method. According to the present invention, any metals having the melting point higher than Si can be used. That is, a crucible is formed of a metal having a large thickness and a high melting point, and the crucible is heated by a resistance heating type heater. Outside the heater, a plurality of reflection plates are provided to reflect the radiant heat of the heater. That is, in the present effusion cell, there is employed a resistance heating method which is different from an electronic beam heating method. No EB gun is used. According to the present effusion cell, there can be used the same shape as a effusion cell which uses an ordinary PBN crucible. Therefore, the present effusion cell can be mounted onto a port for an ordinary effusion cell and occupies only half the space that is occupied by the EB gun.

There may be raised a question why the melted Si liquid can be held by the cylindrical metal crucible having a high melting point. Si is a metal which is very strong in reactivity and reacts heavily on any metal at the melting point thereof. This is true but, if Si reacts with a metal, then there is produced a compound called a silicide. The silicide is a material which is more stable than Si. If a silicide having a certain degree of thickness is produced, then the silicide shuts off the melted Si liquid to thereby protect the metal against the melted Si liquid. This prevents the reaction between the melted Si liquid and metal crucible from progressing any further. After the metal silicide is produced, the metal crucible is protected by the metal silicide and is thereby stabilized. If the metal crucible has a thickness of 3 mm or more, then the silicide is prevented from appearing up to the outside. Consequently, the metal layer can be protected. The reason why the crucible must be formed of tantalum, molybdenum or tungsten is to be able to endure high temperatures higher than the melting point of Si. More preferably, the crucible may be structured such that the inner surface thereof is previously reacted on Si to thereby produce a suicide layer and the inner surface of the crucible is coated with the silicide layer.

The present inventors have developed a resistance heating type effusion cell for Si for many years. The reason for this is as follows: that is, in the case of a PBN crucible, because it must be raised up to high temperatures, nitrogen appears and such nitrogen reacts on the melted Si liquid, which makes it impossible to use the PBN crucible for Si; a quartz crucible also reacts on Si, so that the quarts crucible becomes fragile and is thus easy to break; and, when a PBN crucible is coated with "palyrolytic" carbon, the PBN crucible also breaks.

The present inventors have made and tested a crucible which was formed of tantalum and had a thickness of 0.1 mm to 1 mm, but the test showed that Si melted the tantalum crucible to thereby form holes in the crucible. The present inventors have also made and tested crucibles which were respectively formed of tungsten and molybdenum but, the tests showed that, if the crucible had a thickness of 1 mm or less, then Si made holes in the crucible.

In view of the above, the present inventors made a tantalum crucible having a thickness of 3 mm or more, built the tantalum crucible into a effusion cell, and tested it. This test showed that the melted Si liquid could be held and a Si molecular beam could be produced. A crucible having a thickness of as large as 3 mm had never been known before our test. In particular, in this crucible, the surface of the crucible that is contacted with the melted Si liquid is turned into a silicide to thereby be able to protect the main body of the crucible against the reactive property of Si. That is, the present inventors have defined the common practice of this field and solved a difficult problem relating to a Si crucible.

Preferred embodiments of the present invention will be described as follows referring to the accompanying drawings.

Figure 4:
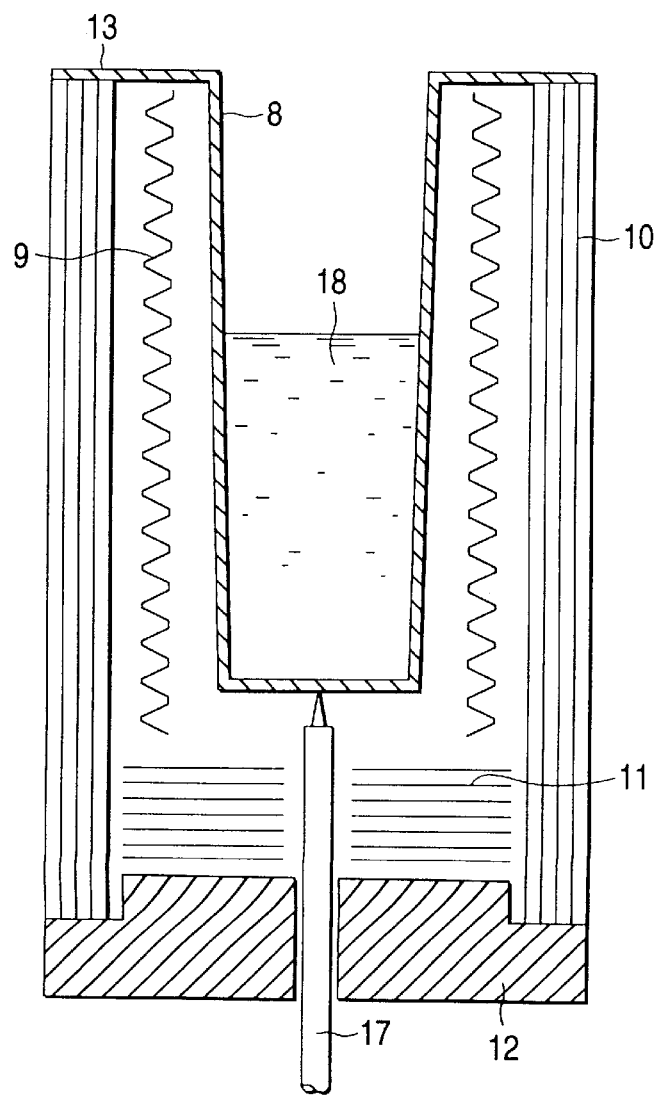
FIG. 4 is a section view of a conventional effusion cell which is composed of a PBN crucible and a resistance heating type heater.
Figure 5:
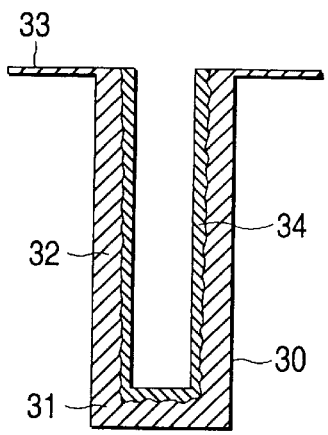
FIG. 5 is a section view of a cylindrical metal crucible having a large thickness, which is used in an effusion cell according to the invention.
Figure 6:
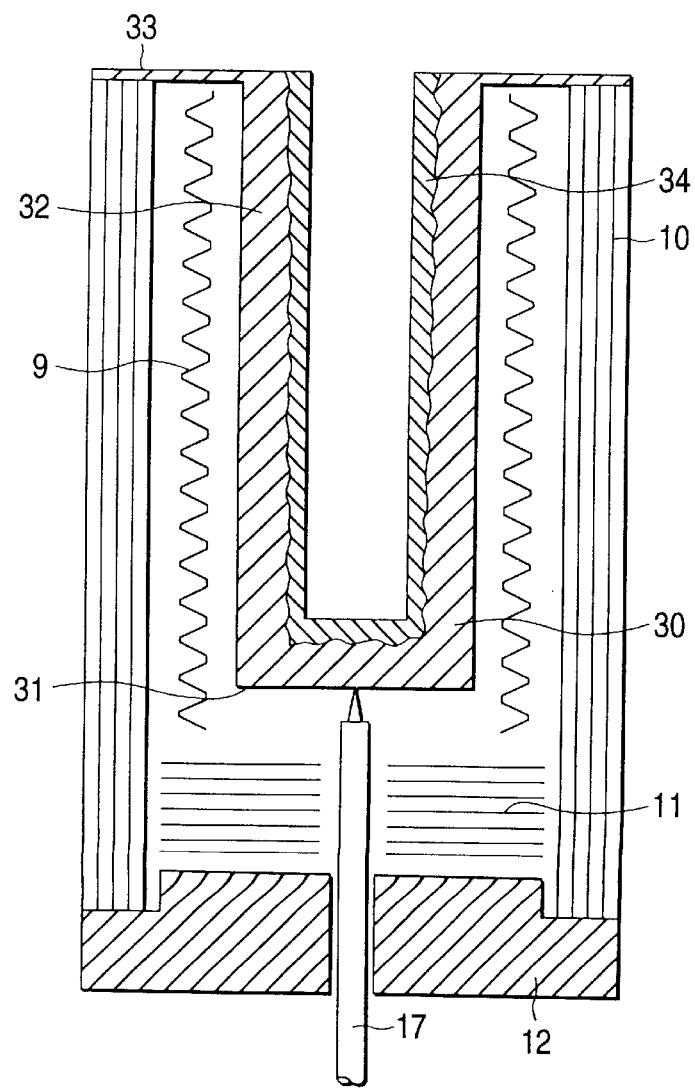
FIG. 6 is a section view of an effusion cell for Si according to the invention, using a cylindrical metal crucible having a large thickness.

FIG. 5 is a section view of a crucible for Si according to the present invention. The crucible for Si according to the present invention is formed of tantalum, molybdenum, or tungsten and has a cylindrical shape with a bottom. The present crucible 30 is large in thickness and includes a bottom portion 31, a cylindrical portion 32, a flange portion 33 and a silicide layer 34. The bottom portion 31 and cylindrical portion 32 respectively have a thickness of 3 mm or more; for example, 5 mm, or 4 mm. However, since the flange portion 33 will never be contacted directly with the melted Si liquid, the thickness of the flange portion 33 may be 3 mm or less. Now, the thus structured crucible is used as a crucible for such an effusion cell as shown in FIG. 4. That is, the PBN crucible may simply be replaced with the present crucible. FIG. 6 is a section view of a effusion cell for Si according to an embodiment of the invention. The thick metal cylindrical crucible 30 with a bottom is located in the central portion of the present cell. Side surface heaters 9, side surface reflection plates 10, bottom portion reflection plates 11 and the like are disposed similarly to FIG. 4. The flange portion 33 of the crucible 30 is supported by part of the side surface reflection plates 10. The reflection plates 10 and 11 reflect the heat of the heaters toward the crucible. A support plate 12 supports the reflection plates 10 and 11. A prop 14 (FIG. 2) fixes the support plate 12 to an ultrahigh vacuum flange 15. The tip end of a thermocouple 17 is contacted with the bottom portion of the crucible 30. As described above, in the present embodiment, there is employed a similar structure to FIG. 4 in which the flange portion 33 of the crucible 30 is supported by the side face reflection plates 10. The crucible is heated by a ribbon heater or a heater 9 disposed on a coil; that is, the crucible is resistance heated to thereby turn the whole of Si into the melted Si liquid. The surface area of the melted Si liquid is equal to the section area of the crucible and is constant. Since the area of evaporation is the same, the intensity of the molecular beam can be stabilized. In the portion of the crucible that is contacted with Si, the metal of the crucible is turned into a silicide, while the thus produced silicide prevents any further chemical reaction to thereby protect the metal.

Further, if there is added to the present embodiment a device disclosed in Unexamined Japanese Utility Model Publication No. Hei. 3-116027 which is a previous application filed by the present inventors, then there can be obtained better effects. In particular, the heater insulation member may be formed of a sapphire and the heater may be formed of tungsten. Also, alternatively, there is available a method in which the heater is structured as an independent type heater. In this case, since the heater does not use any heater insulation material, there is eliminated the need to use any insulation material.

EXAMPLES

Figure 2:
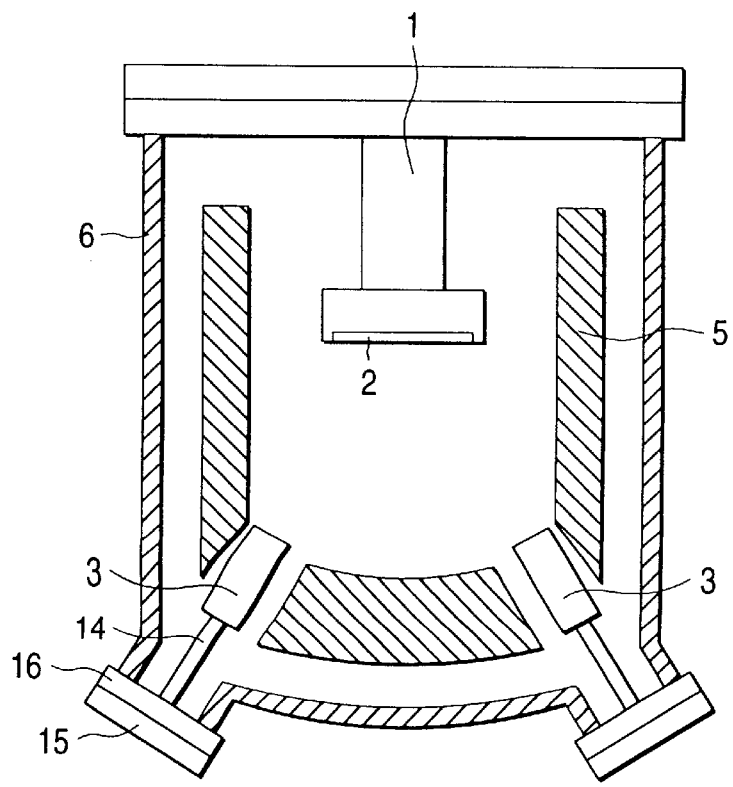
FIG. 2 is a schematic section view of a molecular beam epitaxy system including a Si effusion cell according to the invention using a resistance heating method and a cylindrical crucible.
Figure 3:
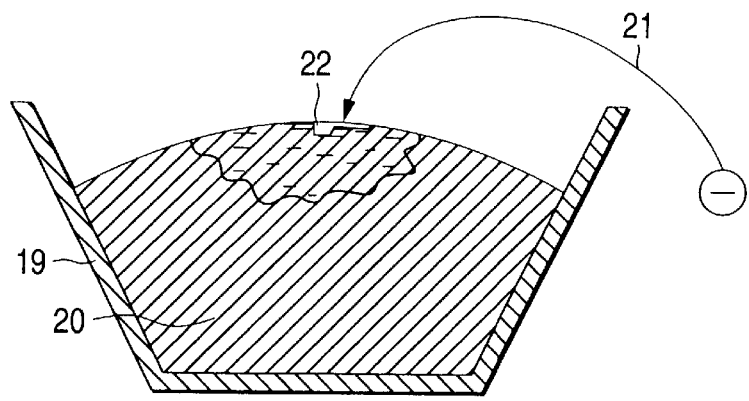
FIG. 3 is a section view of a conventional Si effusion cell of an electronic beam heating type in which an electronic beam is applied to Si solid to heat the Si solid locally to thereby melt part of the Si solid into melted Si liquid, and the melted Si liquid is then evaporated to thereby provide a molecular beam for Si.

The effusion cell according to the invention can be compact as shown in FIG. 6. The molecular beam epitaxy system incorporating the present effusion cell is the same as shown in FIG. 2. In this case, since there are used a resistance heating method and a crucible long in the longitudinal direction, the effusion cell for Si provides an ordinary effusion cell and thus it does not take up much space. In a medium-sized effusion cell epitaxy device, 8 effusion cells can be arranged. Also, Si contained in the interior portion of the crucible is all melted and turned into melted Si liquid. Because the area of the melted Si liquid is constant and the temperatures are also constant, the flux of the molecular beam is stable and the thickness of the Si film can be controlled accurately on the basis of time. In addition to the above two major characteristics, that is, high controllability and space saving, the present invention can provide other advantages. That is, the heater power thereof can be reduced when compared with the EB gun. In particular, the Si molecular beam can be flown by a heater power of the order of 500 W to 1 kW. Also, since no electronic beam is flown, there is no possibility that Si can be ionized. This in turn eliminates the possibility that ions can be attached to the shroud to thereby cause the same to discharge electricity.

Figure 7:
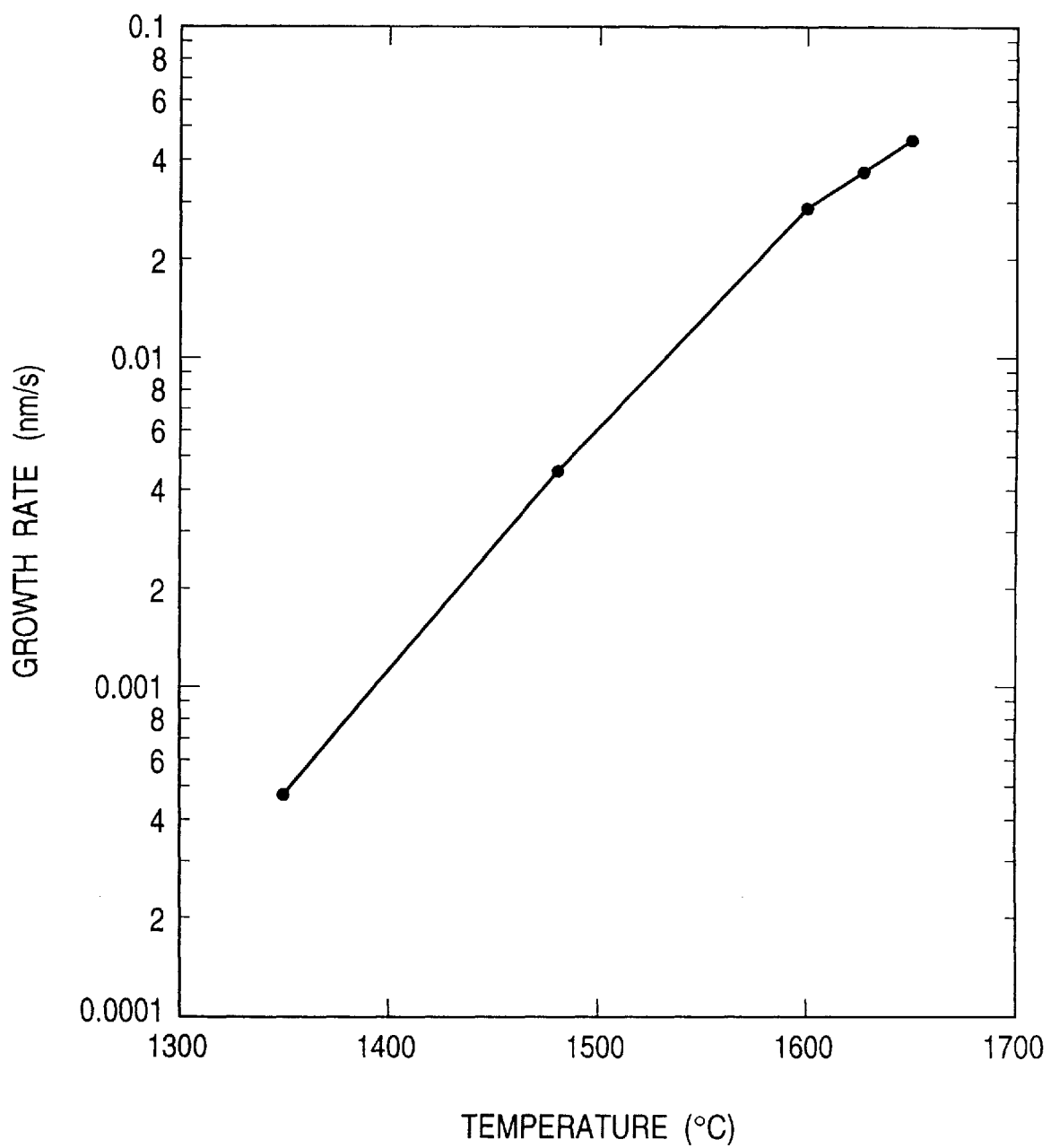
FIG. 7 is a graphical representation of the relationship between the cell temperature (°C.) and the growth rate (nm/s) of a Si thin film obtained when the Si thin film is grown on a Si substrate using a Si effusion cell according to the invention while changing the cell temperature.

The most excellent characteristic of the present invention is the controllability thereof. When compared with the EB gun which is quite difficult to control, the present invention can exhibit high controllability due to use of a resistance heating method. The control parameter of the invention is the heater current. However, since the heater current determines the temperature of the cell, the cell temperature can also be used as the control parameter. The cell temperature is measured by a thermocouple and thus it is a variable which is easy to handle. When a Si thin film was grown on a Si wafer, the relationship between the cell temperature (°C.) and growth rate (nm) was measured. The results of the measurement are shown in FIG. 7. In particular, when the cell temperature is 1350° C., the growth rate is 0.43 pm/s; when the cell temperature is 1489° C., the growth rate is 4.3 pm/s; and, when the cell temperature is 1660° C., the growth rate is of the order of 48 pm/s. By changing the cell temperature by 300° C., the thin film growth rate can be made 100 times. That is, the intensity of the Si molecular beam can be made to vary in the range of 1~100 times. By adjusting the heater power, a molecular beam of a desired intensity can be produced freely.

Figure 8:
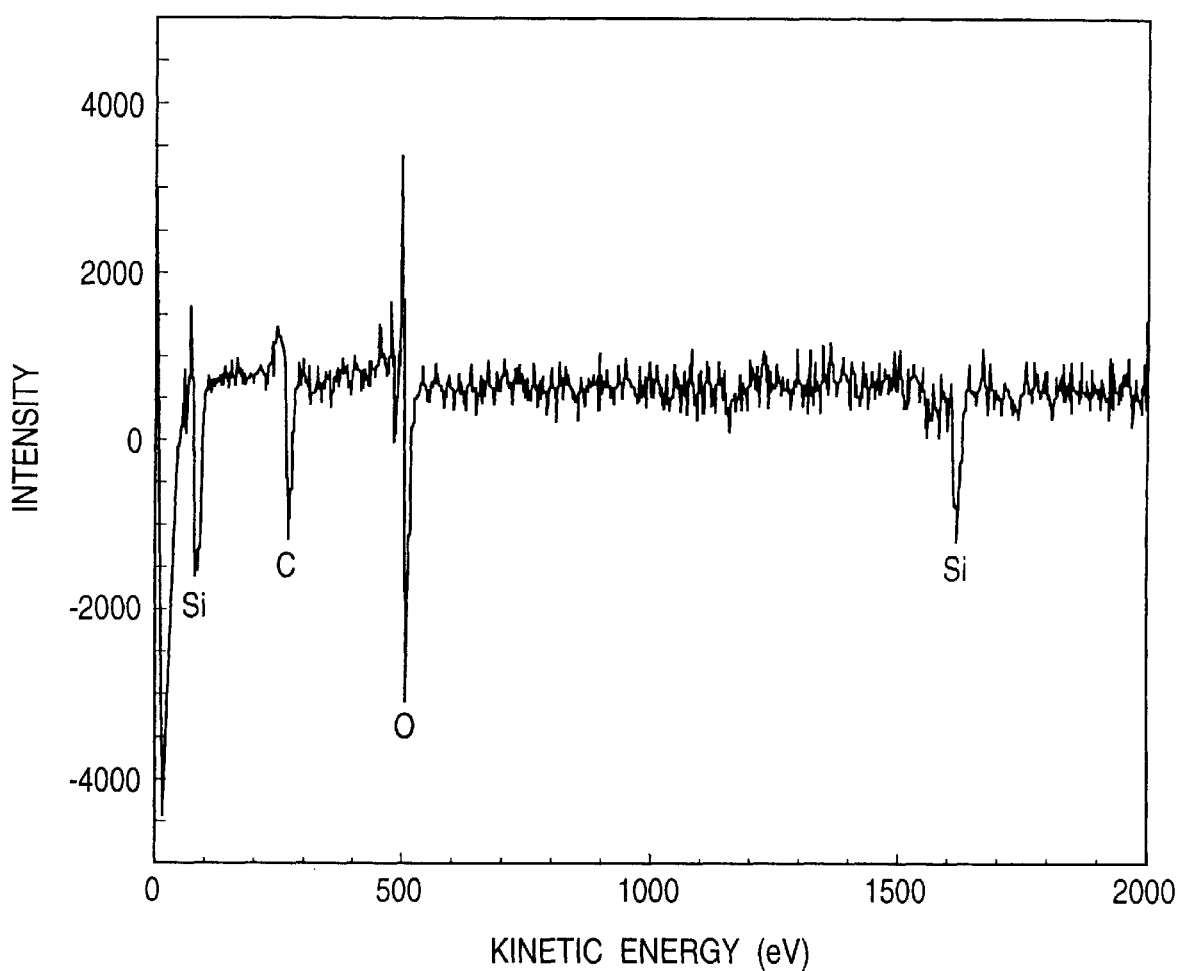
FIG. 8 is a graphical representation of the Auger analysis results of a Si thin film obtained when the Si thin film is grown on a Si substrate using a Si effusion cell according to the invention.

Further, the Auger analysis was executed to the components of the Si thin film grown on a Si substrate, while the results of the analysis are shown in FIG. 8. In FIG. 8, the horizontal axis thereof expresses the kinetic energy (eV) of an electron, whereas the vertical axis thereof expresses the intensity of the electron. When X rays are applied to a specimen, an electron existing in the inner shell thereof is struck out by the X rays. An electron in the outer shell thereof drops into the orbit of the thus struck-out inner-shell electron, thereby emitting X rays. An energy difference between the outer-shell orbit and inner-shell orbit depends on elements and, therefore, the elements can be known in accordance with the intensity of the thus emitted X rays. Although the elements can be decided in accordance with the energy, there are shown only the peaks of Si, C, O and Si in FIG. 8. The peaks of C and O appear as the result of exposure of the Si thin film to the air. That is, only Si exists in the interior portion of the Si thin film. Tantalum, which is the material of the crucible, does not exist in the Si thin film. FIG. 8 also shows that no evaporation occurs in the silicide portion of the crucible. In this manner, according to the invention, a thin film containing fewer impurities therein can be produced.

According to the present invention, a crucible formed of metal and having a large thickness is used to resistance heat and melt Si into melted Si liquid, and the melted Si liquid is then evaporated to thereby provide a molecular beam. The present invention can provide for the first time a practical device which can fly a Si molecular beam having a sufficient flux without using an EB gun. There has been increasing a demand that a Si thin film is caused to grow in an epitaxial manner. Accordingly, the present invention is able to cope with such demand in a well-timed manner. The present invention does not provide such an inexpensive device as a crucible formed of a sapphire. Since the whole of Si is melted by resistance heating into melted Si liquid, the variations in the flux of the molecular beam are greatly smaller when compared with the EB gun. The present invention can grow a Si thin film which is stable in quality and film thickness. Therefore, the present invention is ideally suitable for a molecular beam epitaxy system which is often used to grow a thin film having a delicate film thickness. Also, the conventional molecular beam epitaxy system using an EB gun is rather difficult to handle; but, on the other hand, according to the invention, since an effusion cell having the same shape as the conventional PBN effusion cell can be provided, the present molecular beam epitaxy system is easy to handle. And, because the present effusion cell is smaller in size than the EB gun, a larger number of effusion cells can be mounted in one molecular beam epitaxy system.

What is claimed is:

1. An effusion cell for Si, comprising:

a crucible comprising a metal having a melting point higher than Si and an inner surface portion coated with silicide;

a heater for resistance heating said crucible; and a plurality of reflection plates for reflecting heat produced by said heater.

2. An effusion cell according to claim 1, wherein the crucible includes at least one of tantalum, tungsten, and molybdenum.

3. An effusion cell according to claim 1, wherein the crucible has a thickness of 3 mm or more.

* * * * *